United States Patent [19]
Harmoinen et al.

[11] Patent Number: 5,811,878
[45] Date of Patent: Sep. 22, 1998

[54] HIGH-POWER SEMICONDUCTOR MODULE

[75] Inventors: Martti Harmoinen, Espoo, Finland; Thomas Stockmeier, Rancho Palos Verdes, Calif.

[73] Assignee: Asea Brown Boveri AG, Baden, Switzerland

[21] Appl. No.: 677,203

[22] Filed: Jul. 9, 1996

[51] Int. Cl.[6] .................................................. H01L 23/34
[52] U.S. Cl. ............................ 257/723; 257/724; 257/725
[58] Field of Search ..................................... 257/723, 724, 257/725, 341, 700

[56] References Cited

U.S. PATENT DOCUMENTS 5,541,453  7/1996  Stockmeier et al. ..................... 257/724

OTHER PUBLICATIONS

"Reliable 1200 Amp 2500 V IGBT Modules for Traction Applications," T. Stockmeier, et al. pp. 1–13. IEE IGBT Apr. 25, 1995.

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

In a high-power semiconductor module (10), in which a plurality of first submodules (13, 14, 16, 17) are arranged in an electrically insulated manner in a common housing (12) and on a common cold plate (11) and are interconnected with one another, the first submodules (13, 14, 16, 17) each [lacuna] individual controllable power semiconductor switches (13a), short-circuit-proof operation in conjunction with relatively high switching frequencies is made possible, with a relatively low current-carrying capacity and an increased withstand voltage, by virtue of the fact that the first submodules (13, 14, 16, 17) are connected in series within the module for the purpose of increasing the withstand voltage.

10 Claims, 2 Drawing Sheets

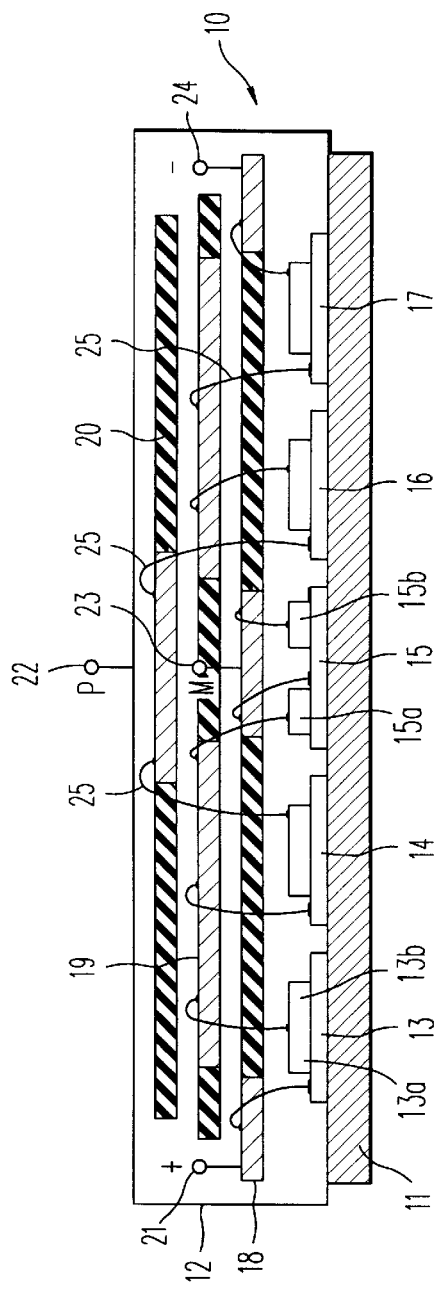
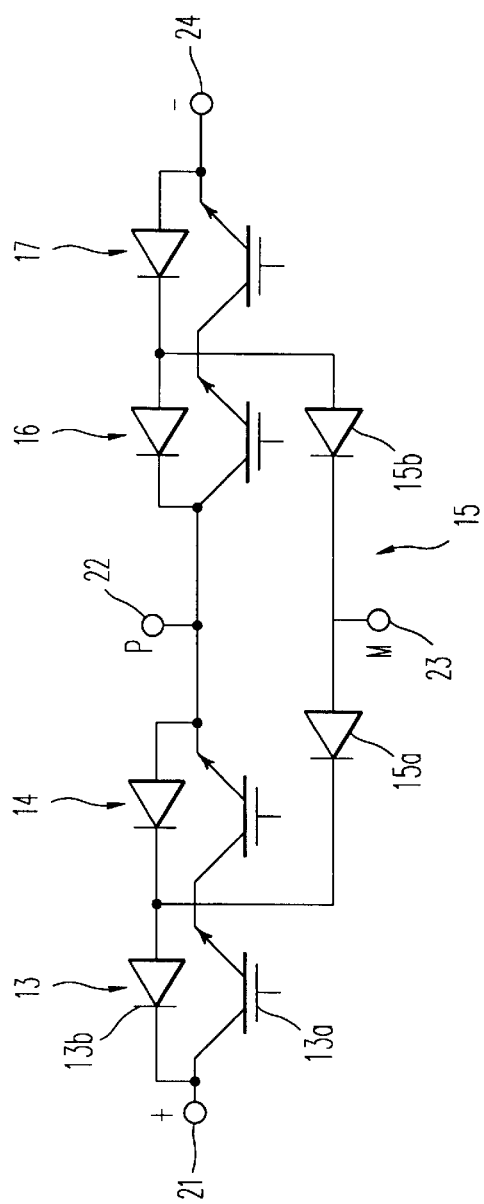

HIGH-POWER SEMICONDUCTOR MODULE

TECHNICAL FIELD

The present invention is concerned with the field of power electronics. It relates to a high-power semiconductor module, in which a plurality of first submodules are arranged in an electrically insulated manner in a common housing and on a common cold plate and are interconnected with one another, the first submodules each containing individual controllable power semiconductor switches.

Such a semiconductor module is disclosed, for example, in an article by T. Stockmeier et al. "Reliable 1200 Amp 2500 V IGBT Modules for Traction Applications", IEE IGBT Propulsion Drives Colloquium, London, 25 Apr. 1995.

PRIOR ART

High-power semiconductor modules are components for power electronics. A module generally contains a plurality of semiconductor components which can be combined to form logical functional units. Example [sic] are rectifiers, individual switches having a reverse-connected parallel diode or entire phase modules. Modules are distinguished from the disk-type thyristors which are customary nowadays in the area of high-power semiconductors essentially by the fact that the cooling arrangement and power connections are electrically insulated from one another.

Such modules (thyristor, transistor, IGBT, MOSFET or diode modules) are nowadays widespread in the power range up to 1200 V and a few 100 A and are primarily used in industrial drives. Modules for high currents generally comprise a multiplicity of individual components which are connected in parallel in the module.

In order to achieve high yields in the production process of such modules, a relatively small number of components are first of all combined to form a practical electrical unit, which can then be appropriately tested. These units (designated as submodules below) are subsequently connected in parallel in a high-power module, in order to achieve the desired current-carrying capacity. With this technology, it is nowadays possible nominally to achieve currents of up to 1800 amperes per module. An example of such a module with 1200 A and 2500 V is described in the article cited in the introduction.

However, numerous industrial applications do not require the highest possible current-carrying capacity, but rather the highest possible withstand voltage, in order to be able to operate the power switch directly from the mains. If the withstand voltage of the individual components is increased for this purpose in the case of the known modules, the switching losses increase considerably, which greatly limits the switching frequency of the converter for a given cooling capacity of the modules. Furthermore, in the case of transistor components (for example IGBTs), the short-circuit strength decreases drastically as the blocking voltage increases. If, on the other hand, a plurality of modules having a low withstand voltage are connected in series, the heat sinks must be operated at a high voltage level, which entails significant system disadvantages.

DESCRIPTION OF THE INVENTION

The object of the invention, therefore, is to provide a high-power semiconductor module having a relatively low current-carrying capacity and an increased withstand voltage, which can be operated at relatively high switching frequencies and in a manner such that at the same time it is short-circuit-proof.

The object is achieved in the case of a semiconductor module of the type mentioned in the introduction by virtue of the fact that the first submodules are connected in series within the module for the purpose of increasing the withstand voltage. The abovementioned problems are advantageously solved by the series circuit formed by the submodules: since the submodules are connected in series, it is possible to achieve a withstand voltage which is higher by a factor of 2, for example, without the switching losses increasing. Since, moreover, all of the submodules are provided on a common cold plate in an electrically insulated manner, it is necessary to take account only of an electrical heat-exchanger potential in the system.

A first preferred embodiment of the module according to the invention is distinguished by the fact that the first submodules each comprise a controllable power semiconductor switch and a reverse-connected parallel diode, that the power semiconductor switch is a transistor, in particular an IGBT, that an even number of first submodules are connected in series, and that a power connection is provided as phase output in the center of the series circuit. As a result, powerful converter circuits can be constructed in a simple and flexible manner using a plurality of modules.

A further preferred embodiment of the module according to the invention is characterized in that a series circuit formed by diodes is provided in the semiconductor module together with the first submodules, for the purpose of establishing a virtual neutral point of the circuit, and in that the diodes are combined to form a second submodule and are arranged jointly on the cold plate with the first submodules. This integration of diodes for producing the virtual neutral point means that any additional circuitry outside the module is dispensed with in a particularly advantageous way.

Further embodiments emerge from the dependent claims.

BRIEF EXPLANATION OF THE FIGURES

The invention will be explained in more detail below using exemplary embodiments in conjunction with the drawing, in which FIG. 1 shows a diagrammatic sectional view of the inner structure of a preferred exemplary embodiment of a high-power semiconductor module according to the invention;

FIG. 2 shows the circuit diagram of the module according to FIG. 1; and

WAYS OF EMBODYING THE INVENTION

Figure 3:
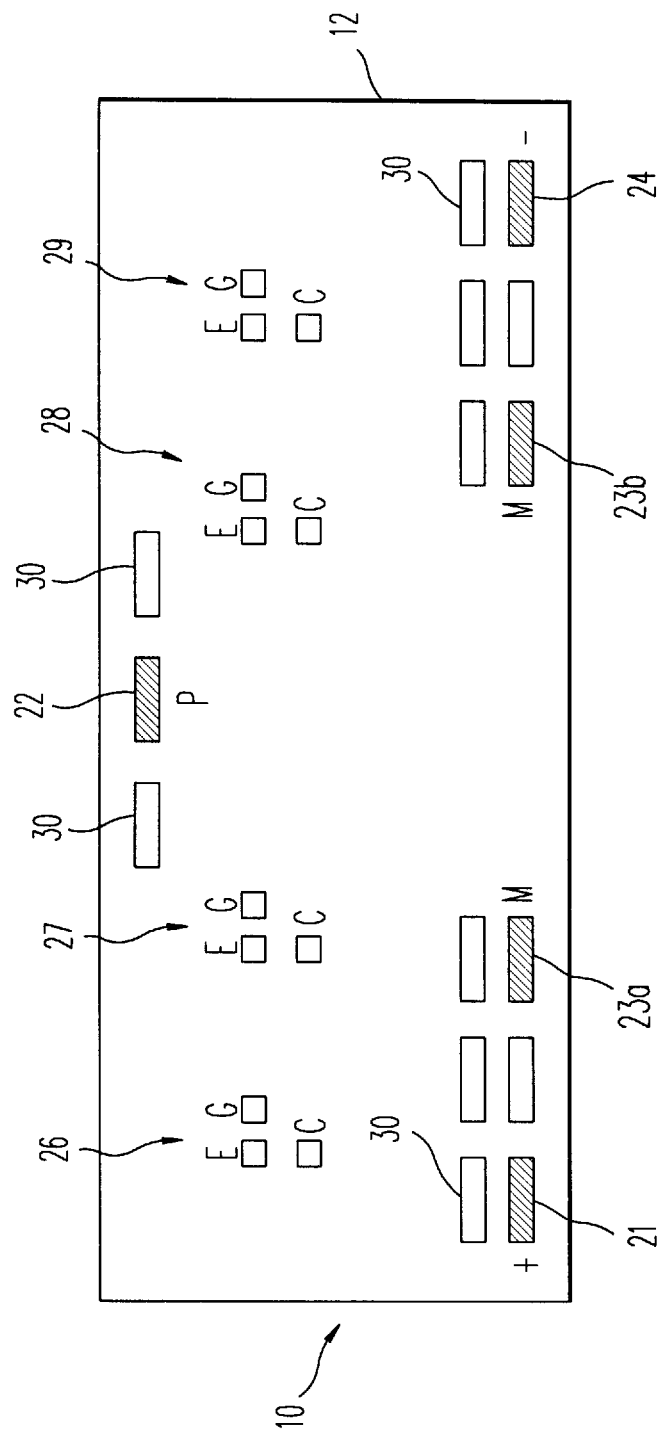
FIG. 3 shows a plan view of the module according to FIG. 1 with the individual power and auxiliary or control connections.

FIG. 1 represents a diagrammatic sectional view of the inner structure of a preferred exemplary embodiment of a high-power semiconductor module according to the invention. A plurality of submodules 13, 14, 15, 16 and 17 are fitted in an electrically insulated manner, within a housing 12, on a preferably rectangular cold plate 11, which may be composed, for example, of Cu having a thickness of two or more mm. Each of the submodules 13–17 comprises a plurality of individual power semiconductors (diodes, IGBTs), which are each arranged on a common ceramic baseplate and are soldered by this baseplate onto the cold plate 11. The four submodules 13, 14, 16 and 17 comprise the controllable power semiconductor switches. According to FIG. 2, these are IGBTs (designated by 13a by way of example for submodule 13) having a reverse-connected parallel diode (designated by 13*b* by way of example for submodule 13). Each IGBT of one of the submodules 13, 14, 16 and 17 in turn comprises a plurality (for example 4) of individual elements connected in parallel, as is described in the article cited in the introduction. A further submodule 15 comprises two diodes 15*a* and 15*b* connected in series. According to FIG. 2, these diodes 15*a, b* are required to produce a virtual neutral point M of the circuit.

Power connections 21, 22, 23 and 24 are provided for the external electrical connection of the semiconductor module 10 and usually project as lugs from the housing 12, but are only indicated diagrammatically in FIG. 1 for the sake of clarity. The power connections 21 (+) and 24 (−) are respectively provided for the connection of the corresponding DC voltage potential. They are routed out at the opposite ends of the module (see FIG. 3 as well) in order to produce clearances and creepage paths which are as long as possible. The power connection 22 (P) is the phase output of the bridge path. The power connection 23 (M) is the already mentioned virtual neutral point of the circuit. The electrical connection between the semiconductor elements or submodules 13–17 and the power connections 21–24 is effected via a stack of connection plates 18, 19 and 20 which are arranged in an insulated manner and in parallel over one another and, for example, can be designed as metal plates and insulated from one another by insulating layers lying in between. The connection between the submodules 13–17 and the connection plates 18–20 is preferably effected by means of wire bonding using bonding wires 25, or by means of soldering technology using soldering clips.

The preferred interconnection between the individual elements within the individual submodules 13–17 and between the submodules is represented in the circuit diagram in FIG. 2: the submodules 13, 14, 16 and 17 each contain an IGBT (as a parallel circuit formed by a plurality of IGBT elements) and a diode, which is reverse-connected in parallel with the IGBT between the collector and emitter. These four submodules are connected in series within the high-power semiconductor module 10, the collector of one IGBT in each case being connected to the emitter of the next IGBT. The tap for the phase output P is provided between the first two submodules 13, 14 and the other two submodules 16, 17. The series circuit formed by the diodes 15*a*, 15*b* of the other submodule 15 is connected between the first and second submodule 13 and 14 and between the third and fourth submodule 16 and 17. The tap for the virtual neutral point M is provided between the two diodes 15*a*, 16*a* [sic] of the submodule 15. This produces an NPC (Neutral Point Clamped) module.

In addition to the series circuit formed by the first submodules 13, 14, 16 and 17, at least one further identical series circuit of submodules can be provided for the purpose of increasing (doubling) the current-carrying capacity, which identical series circuit of submodules is connected in parallel with the series circuit formed by the first submodules 13, 14, 16 and 17 within the semiconductor module 10. In the case of this further series circuit, which is not illustrated in the figures, corresponding diodes for establishing a virtual neutral point are present in the same way as in the series circuit in FIG. 2.

The arrangement of the power connections 21–24 on the top side of the semiconductor module 10 is shown in FIG. 3. The elongate rectangles designate openings for lug-like connections to the outside. The filled-in rectangles are equipped with connecting lugs for the corresponding power connections 21–24, the power connection for the virtual neutral point M (23 in FIGS. 1, 2) being subdivided into two parallel power connections 23*a* and 23*b*. The rectangles which are not filled in are openings 30 in the housing 12 for parallel connections which are required in high-current modules but remain unused here. The phase output P is routed out at the side opposite to the connections (+) and (−). In contrast, the virtual neutral point M is provided on the same side, since these three connections 21, 23*a, b* and 24 must be passed with the lowest possible inductance to the intermediate circuit capacitor (of an intermediate circuit converter). In addition, the auxiliary connections 26, 27, 28 and 29 (each with gate G, emitter E and collector C) which are required for driving the gates of the IGBTs are also routed out on the top side. The necessary drive unit can be screwed directly onto the module 10 on the top side, and the connection to the auxiliary connections can advantageously be implemented by means of through-plating, in the same way as is described in the article cited in the introduction.

Overall, the invention provides a high-power semiconductor module which, with a relatively low current-carrying capacity and an increased withstand voltage, can be operated at relatively high switching frequencies and in a manner such that at the same time it is short-circuit-proof.

| LIST OF DESIGNATIONS | |
|---|---|
| 10 | High-power semiconductor module |
| 11 | Cold plate |
| 12 | Housing |
| 13–17 | Submodule |
| 13a | Power semiconductor switch (IGBT) |
| 13b | Diode |
| 15a, b | Diode |
| 18, 19, 20 | Connection plate |
| 21–24 | Power connection |
| 23a, b | Power connection |
| 25 | Bonding wire |
| 26–29 | Auxiliary connections |
| 30 | Opening |
| C | Collector |
| G | Gate |
| E | Emitter |
| M | Virtual neutral point |
| P | Phase output |

We claim:

1. A high-power semiconductor module comprising a plurality of first submodules, wherein said first submodules are arranged in an electrically insulated manner in a common housing and on a common cold plate, are interconnected with one another, and contain individual controllable power semiconductor switches, wherein an even number of said first submodules are connected in series within the module to increase the withstand voltage and a power connection is provided as phase output (P) in the center of the series circuit, wherein a series circuit formed by at least two diodes is provided in the semiconductor module together with the first submodules in order to provide a virtual neutral point (M).

2. Semiconductor module according to claim 1, wherein the diodes are combined to form a second submodule and are arranged jointly on the cold plate with the first submodules.

3. Semiconductor module according to claim 2, wherein four first submodules are connected in series, wherein the diode series circuit contains two diodes wherein the diode series circuit is connected between the first and second submodule and between the third and fourth submodule and wherein the tap for the virtual neutral point M is provided between the two diodes.

4. Semiconductor module according to claim 3, wherein in addition to the series circuit formed by the first submodules, at least one further identical series circuit of submodules is present for the purpose of increasing the current-carrying capacity, and wherein both series circuits are connected in parallel within the semiconductor module.

5. Semiconductor module according to one of the claims 1–4, wherein the first submodules each comprise a controllable power semiconductor switch and a reverse-connected parallel diode.

6. Semiconductor module according to claim 5, wherein the power semiconductor switch is a transistor, in particular an IGBT.

7. Semiconductor module according to claim 6, wherein a plurality of connection plates, which are arranged in an insulated manner and in parallel over one another and over the submodules, are provided for the purpose of connecting the submodules to power connections which are routed out of the housing.

8. Semiconductor module according to claim 7, wherein the electrical connection between the submodules and the connection plates is effected by means of bonding wires.

9. Semiconductor modules according to claim 7, wherein the electrical connection between the submodules and the connection plates is effected by means of soldering clips.

10. Semiconductor module according to claim 7, wherein, in order to control the controllable power semiconductor switches, auxiliary connections are routed upwards out of the housing, in such a way that they are directly connected to a drive unit which can be fitted on the housing.

* * * * *